(12) United States Patent
Ueno et al.

(10) Patent No.: US 6,975,171 B2
(45) Date of Patent: Dec. 13, 2005

(54) BALANCED AMPLIFIER AND FILTER USING THE SAME

(75) Inventors: Takeshi Ueno, Kawasaki (JP); Tetsuro Itakura, Tokyo (JP); Zdzislaw Czarnul, deceased, late of Gdansk (PL); by Krystyna Czarnul, legal representative, Gdansk (PL)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/059,380

(22) Filed: Feb. 17, 2005

(65) Prior Publication Data

US 2005/0146381 A1 Jul. 7, 2005

Related U.S. Application Data

(62) Division of application No. 10/790,110, filed on Mar. 2, 2004, now Pat. No. 6,876,256, which is a division of application No. 10/281,103, filed on Oct. 28, 2002, now Pat. No. 6,781,464.

(30) Foreign Application Priority Data

Oct. 30, 2001 (JP) .............................. 2001-331805
Mar. 28, 2002 (JP) .............................. 2002-090388

(51) Int. Cl.$^7$ .............................................. H03F 3/45
(52) U.S. Cl. ..................................... 330/258; 330/252
(58) Field of Search ............................... 330/258, 252, 330/69, 275, 301, 310, 116; 327/359

(56) References Cited

U.S. PATENT DOCUMENTS

| | | | | |
|---|---|---|---|---|
| 4,742,308 A | * | 5/1988 | Banu | .......................... 330/258 |
| 4,970,470 A | * | 11/1990 | Gosser | ........................ 330/252 |
| 5,345,190 A | | 9/1994 | Kaylor | |
| 5,491,447 A | | 2/1996 | Goetschel et al. | |
| 5,696,457 A | | 12/1997 | Rezzi et al. | |
| 5,963,088 A | | 10/1999 | Czarnul et al. | |
| 5,990,737 A | | 11/1999 | Czarnul et al. | |
| 6,169,454 B1 | * | 1/2001 | Hogeboom | .................. 330/258 |
| 6,329,849 B1 | | 12/2001 | Czarnul et al. | |

FOREIGN PATENT DOCUMENTS

| | | |
|---|---|---|
| JP | 10-51247 | 2/1998 |
| JP | 11-17466 | 1/1999 |
| JP | 2000-148262 | 5/2000 |

OTHER PUBLICATIONS

Zdzislaw Carnul, et al., "Design of Ully Balanced Analog Systems Based on Ordinary and/or Modified Single-Ended OPAMPS", IEICE Trans. Fundamentals, vol. E82-A, No. 2 Feb. 1999, pp. 256-270.

Tetsuro Itakura et al., "A 2-V pp Linear Input-Range Fully Balanced CMOS Transconductor and its Application to a 2.5 V 2.5 MHz, Gm-C LPF", IEICE Trans. Fundamentals vol. E83-A, No. 11, Nov. 2000, pp., 2295-2302.

* cited by examiner

Primary Examiner—Henry Choe

(74) Attorney, Agent, or Firm—Oblon, Spivak, McClelland, Maier & Neustadt, P.C.

(57) ABSTRACT

A balanced amplifier comprising a pair of voltage-to-current converters including a first input terminal, a second input terminal, a first output terminal and a second output terminal to convert an input voltage applied to the first input terminal into an output current output from each of the first output terminal and the second output terminal, the second input terminal and the second output terminal of one of the converters being connected to the second input terminal and the second output terminal of the other of the converters to cancel common-mode components each other and extract differential-mode components.

12 Claims, 5 Drawing Sheets

US 6,975,171 B2

BALANCED AMPLIFIER AND FILTER USING THE SAME

CROSS-REFERENCE TO RELATED APPLICATIONS

This application is a division of and is a based upon under 35 USC §120 from U.S. Ser. No. 10/790,110, filed Mar. 2, 2004, now U.S. Pat. No. 6,876,256 which is a division of 10/281,103 filed Oct. 28, 2002 now U.S. Pat. No. 6,781,464, issued Aug. 24, 2004 and claims the benefit of priority under 35 USC §119 from Japanese Patent Applications No. 2001-331805, filed Oct. 30, 2001; and No. 2002-090388, filed Mar. 28, 2002, the entire contents of both of which are incorporated herein by reference.

BACKGROUND OF THE INVENTION

1. Field of the Invention

The present invention relates to a balanced amplifier and a filter using the same and, more particularly, to a balanced amplifier whose maximum value of an output signal amplitude is larger than that of a conventional amplifier even at a low voltage, and a filter using the same.

2. Description of the Related Art

A balanced amplifier has a gain only for the differential-mode components of an input signal and removes common-mode components. This balanced amplifier can remove noise mixed as common-mode components and double the amplitude of a differential signal as compared with the amplitude of a single-ended signal. Owing to such advantages, the balanced amplifier is widely used in analog-digital mixed integrated circuits and circuits that operate at low voltages. A circuit for removing common-mode components has been proposed (Jpn. Pat. Appln. KOKAI Publication No. 2000-148262) which is configured by a combination of a differential pair and a common-mode feedback (to be referred to as CMFB hereinafter) circuit and removes common-mode components from an input voltage.

In such a conventional circuit, since the common-mode component removing property of the differential pair is used, the number of cascaded transistors which are stacked is limited, and the maximum value of an output signal amplitude is too small when this circuit operates at a low voltage.

For example, in many semiconductor integrated circuits, analog circuits are formed on the same chip on which digital circuits are fabricated. In order to increase the integration degree of circuits, it is advantageous that digital and analog circuits operate at the same voltage. With advances in microprocessing, however, the power supply voltage is further decreased.

For example, the operating voltage for a digital circuit in a 0.11-$\mu$m process integrated circuit that is expected to be commercialized in the near future is about 1.5 V. With a reduction in the size of a process integrated circuit, the operating voltage is expected to further decrease. When the power supply voltage further decreases in this manner, the differential pair cannot exhibit sufficient performance, i.e., a sufficient output amplitude cannot be obtained, when it is operated at the same voltage as that for the digital circuit. Therefore, it may become difficult to obtain a sufficient noise removing effect even if a noise removing circuit is formed by using a balanced amplifier.

It is an object of the present invention to provide a balanced amplifier in which the upper limit of output signal amplitudes is high even at a low voltage and a filter which uses the balanced amplifier and can exhibit sufficient performance even at a low voltage.

BRIEF SUMMARY OF THE INVENTION

According to an aspect of the invention, there is provided a balanced amplifier comprising: a pair of voltage-to-current converters each including a first input terminal, a second input terminal, a first output terminal and a second output terminal, each of the voltage-to-current converters converting differential input voltages applied to the first input terminals of the converters into output currents output from both of the first output terminal and the second output terminal of each of the converters, wherein the second input terminals and the second output terminals of the converters are connected in common to cancel common-mode components and extract differential components.

According to another aspect of the invention, there is provided a balanced amplifier comprising a first voltage-to-current converter and a second voltage-to-current converter, each of the first voltage-to-current converter and the second voltage-to-current converter including a first input terminal, a second input terminal, a first current source which outputs a first current, a second current source which outputs a second current, a first output terminal outputting a third current and a second output terminal outputting a fourth current, wherein the third current is obtained by subtracting a sum current from the first current, the sum current corresponding to sum of currents corresponding to voltages applied to the first input terminal and the second input terminal respectively, and the fourth current being obtained by subtracting the sum current from the second current, and wherein the second input terminal and second output terminal of the first voltage-to-current converter and the second input terminal and second output terminal of the second voltage-to-current converter is connected in common, a differential input signal is input to the first input terminals of the first voltage-to-current converter and the second voltage-current converter, and a differential output signal is output from the first output terminal of the first voltage-to-current converter and the second voltage-current converter.

According to another aspect of the invention, there is provided a balanced amplifier comprising a first voltage-to-current converter and a second voltage-to-current converter, each of the first voltage-to-current converter and the second voltage-to-current converter including a first input terminal, a second input terminal, a first output terminal and a second output terminal, and each supplying a current corresponding to sum of currents corresponding to voltages applied to the first input terminal and the second input terminal respectively to the first output terminal and the second output terminal so that a polarity of an output signal from the first output terminal is reversed with respect to a polarity of an input signal to the first input terminal, and a polarity of an output signal from the second output terminal is reversed with respect to a polarity of an input signal to the second input terminal, wherein the second input terminals and second output terminals of the converters is connected in common, a differential input signal is input to the first input terminals of the converters, and a differential output signal is output from the first output terminals of the converters.

According to another aspect of the invention, there is provided a voltage-to-current converter comprising a first input terminal, a second input terminal, a first output terminal, a second output terminal, an adder which adds voltage signals supplied to the first input terminal and the second input terminal respectively, a first inverting amplifier which reverses and amplifies an output of the adder; a second inverting amplifier which reverses and amplifies the output of the adder, a third inverting amplifier which reverses and amplifies an output of the first inverting amplifier and outputs a first reversed and amplified signal to the first output terminal as a first current signal; a fourth inverting amplifier which reverses and amplifies an output of the second inverting amplifier and outputs a second reversed and amplified signal to the second output terminal as a second current signal; a first capacitor connected between an input terminal and an output terminal of the third inverting amplifier, and a second capacitor connected between an input terminal and an output terminal of the fourth inverting amplifier.

DETAILED DESCRIPTION OF THE INVENTION

A balanced amplifier and a filter using it according to the present invention will be described below with reference to the views of the accompanying drawing.

FIRST EMBODIMENT

Figure 1:
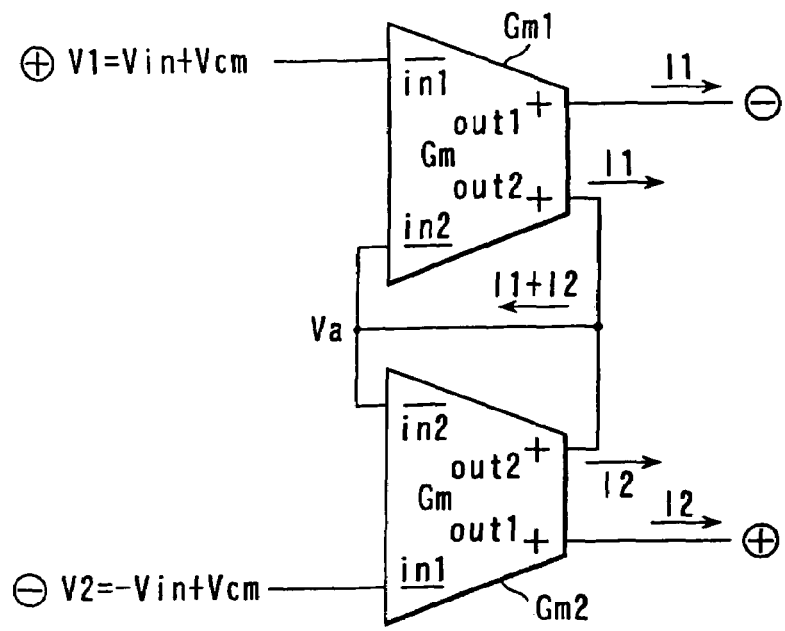
FIG. 1 is a block diagram of a balanced amplifier according to the first embodiment of the present invention.

According to the first embodiment of the present invention shown in FIG. 1, a balanced amplifier comprises voltage-to-current converters Gm1 and Gm2 each having four terminals, namely negative phase input terminals in1 and in2 and positive phase output terminals out1 and out2. The positive phase output terminal out2 and negative phase input terminal in2 of the voltage-to-current converter Gm1, and the positive phase output terminal out2 and negative phase input terminal in2 of the voltage-to-current converter Gm2 are commonly connected. Differential input signals are input from the negative phase input terminal in1 of the voltage-to-current converter Gm1 and the negative phase input terminal in1 of the voltage-to-current converter Gm2. Differential output signals are output from both the positive phase output terminal out1 of the voltage-to-current converter Gm1 and the positive phase output terminal out1 of the voltage-to-current converter Gm2.

The operations of the voltage-to-current converters Gm1 and Gm2 will be described. Each of the voltage-to-current converters Gm1 and Gm2 converts input voltages to the negative phase input terminals in1 and in2 into currents and outputs them to both the positive phase output terminals out1 and out2. The output from the positive phase output terminal out1 depends on both the negative phase input terminals in1 and in2. Likewise, the output from the positive phase output terminal out2 depends on both the negative phase input terminals in1 and in2.

The operation of the balanced amplifier according to this embodiment will be described next. For the sake of simple explanation, assume that the currents output from the positive phase output terminals out1 and out2 of the voltage-to-current converters Gm1 and Gm2 are always equal. In practice, however, the output current from the positive phase output terminal out1 may differ from the output current from the positive phase output terminal out2.

Letting V1 be the input voltage to the voltage-to-current converter Gm1, V2 be the input voltage to the voltage-to-current converter Gm2, 2Vin be the differential component of the input voltage, and Vcm be a common-mode component, V1=Vin+Vcm and V2=−Vin+Vcm. Letting Gm be the transconductances of the voltage-to-current converters Gm1 and Gm2, I1 be the outputs from the positive phase output terminals out1 and out2 of the voltage-to-current converter Gm1, I2 be the outputs from the positive phase output terminals out1 and out2 of the voltage-to-current converter Gm2, and Va be the potential on a line connecting the four terminals in2 and out2 of the voltage-to-current converters Gm1 and Gm2, output currents are obtained by converting input voltages and given by I1=−Gm(V1+Va) and I2=−Gm(V2+Va). Since the input impedances of the voltage-to-current converters Gm1 and Gm2 are very high, the fed-back currents cannot flow into either of the negative phase input terminals in2 of the voltage-to-current converters Gm1 and Gm2. Therefore, n+I2=0.

When Va, I1, and I2 are calculated from I1=−Gm(V1+Va) and I2=−Gm(V2+Va), Va=−Vcm, n=−Gm·Vin, I2=Gm·Vin. As is obvious, therefore, a feedback is applied to the negative phase input terminal in2 to cancel out a common-mode component, and the common-mode component is removed from the output current.

Figure 8:
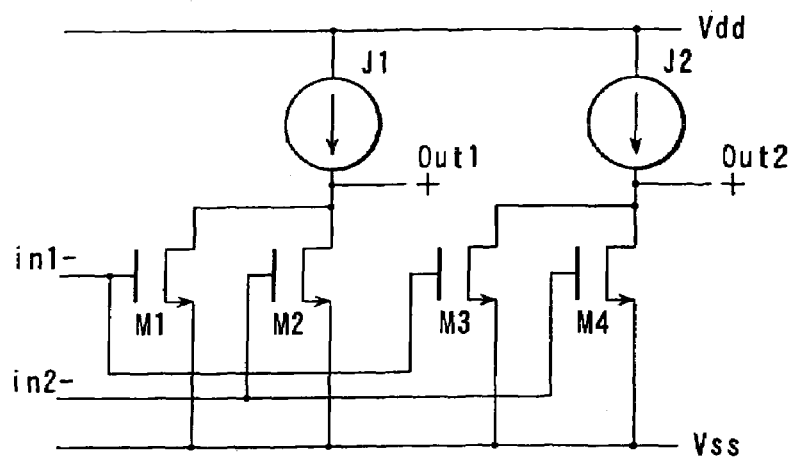
FIG. 8 is a circuit diagram showing an example of the practical arrangement of a voltage-to-current converter when a common source first-stage amplifier is used for each of the voltage-to-current converters Gm1 to Gm3 in FIGS. 1 to 6.

FIG. 8 shows the first practical arrangement example of the voltage-to-current converters Gm1 and Gm2 used in this embodiment. The circuit shown in FIG. 8 is comprised of a power supply line having a potential Vdd, a power supply line having a potential Vss, negative phase input terminals in1 and in2, positive phase output terminals out1 and out2, current sources J1 and J2, and n-channel transistors M1 to M4 which receive signals from the input terminals.

The sources of the n-channel transistors M1 to M4 are connected to the power supply line having the potential Vss, and one terminal of each of the current sources J1 and J2 is connected to the power supply line having the potential Vdd. The other terminal of the current source J1 and the drains of the transistors M1 and M2 are commonly connected. The positive phase output terminal out1 is connected to this connecting line. The other terminal of the current source J2 and the drains of the transistors M3 and M4 are commonly connected, and the positive phase output terminal out2 is connected to this connecting line. The gates of the transistors M2 and M4 are connected to each other, and the negative phase input terminal in2 is connected to this connecting line. With this arrangement, a two-input/two-output voltage-to-current converter is formed.

The operation of the voltage-to-current converter shown in FIG. 8 will be described. Operation associated with an output current from the positive phase output terminal out1 will be described first.

A current corresponding to an input voltage to the negative phase input terminal in1 flows in the drain-to-source path of the transistor M1. Likewise, a current corresponding to an input voltage to the negative phase input terminal in2 flows in the drain-to-source path of the transistor M2. With this operation, an output current from the positive phase output terminal out1 is equal to the current obtained by subtracting the sum of currents corresponding to the input voltages to the negative phase input terminals in1 and in2 from the current supplied from the current source J1. This also applies to the positive phase output terminal out2. That is, an output current from the positive phase output terminal out2 is equal to the current obtained by subtracting the sum of currents corresponding to the input voltages to the negative phase input terminals in1 and in2 from the current supplied from the current source J2.

In the current-to-voltage converter shown in FIG. 8, letting Vsat be the saturation voltage of each transistor, and Vt is a threshold voltage, a maximum value Vmax of an output signal amplitude is the value obtained by subtracting the terminal-to-terminal voltage of the current source J1, the drain-to-source voltage of the transistor M1, and Vss from the operating voltage Vdd. The current source J1 generally has a transistor to the gate of which a predetermined voltage is applied. In addition, the potential difference between the two terminals needs to be at least Vsat in order to make this arrangement operate as a current source. Therefore, Vmax=Vdd−Vsat−Vsa−Vss=Vdd−2sat−Vss.

If, for example, the power supply voltage Vdd is 0.2 V; the threshold voltage Vt, 0.5 V; power supply voltage Vdd, 1.0V; and Vss, 0V (ground), then Vmax= 0.6 V. That is, the maximum value of the output signal amplitude increases as compared with the conventional balanced amplifier comprising a combination of a differential pair and CMFB circuit. It is expected that this amplifier can exhibit sufficient performance even at a voltage lower than that for the conventional balanced amplifier.

Figure 9:
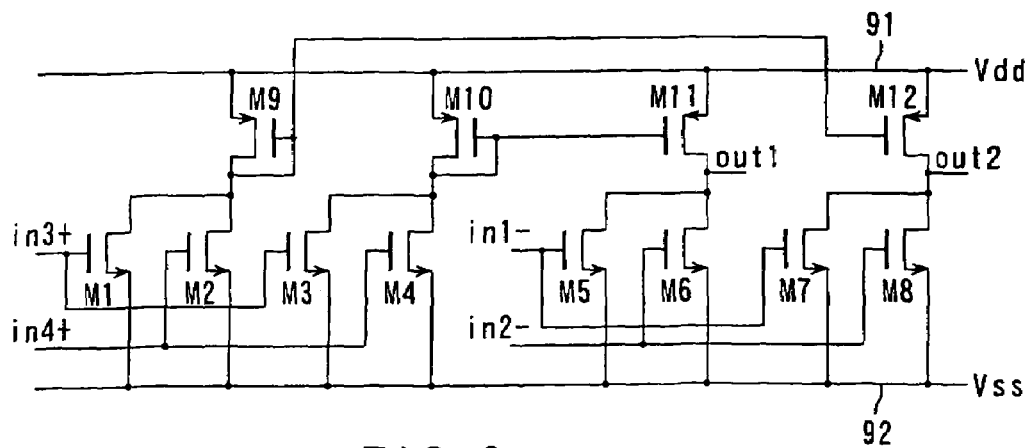
FIG. 9 is a circuit diagram showing an example of the practical arrangement of a voltage-to-current converter when a common source first-stage amplifier is used for each of the voltage-to-current converters Gm1 to Gm3 in FIGS. 1 to 6.

FIG. 9 shows the second practical arrangement example of the voltage-to-current converters Gm1 and Gm2 used in this embodiment. This circuit comprises a power line 91 having a potential Vdd, a power line 92 having a potential Vss, negative phase input terminals in1 and in2, positive phase output terminals out1 and out2, n-channel transistors M1 to M8, and p-channel transistors M9 to M12.

The sources of the transistors M1 to M8 are connected to the power line 92. The sources of the transistors M9 to M12 are connected to the power line 91. The drains of the transistors M5, M6, and M11 are commonly connected. The positive phase output terminal out1 is connected to this connecting line. The drains of the transistors M7, M8, and M12 are commonly connected. The positive phase output terminal out2 is connected to this connecting line. The gates of the transistors M5 and M7 are connected to each other. The negative phase input terminal in1 is connected to this connecting line. The gates of the transistors M6 and M8 are connected to each other. The negative phase input terminal in2 is connected to this connecting line. The gates of the transistors M1 and M3 are connected to each other. A positive phase input terminal in3 is connected to this connecting line. The gates of the transistors M2 and M4 are connected to each other. A positive phase output terminal in4 is connected to this connecting line. The gate of the transistor M11, the gate and drain of the transistor M10, and the drains of the transistors M3 and M4 are commonly connected. Likewise, the gate of the transistor M12, the gate and drain of the transistor M9, and the drains of the transistors M1 and M2 are commonly connected. With this arrangement, a negative phase two-input/positive phase two-input/ positive phase two-output voltage-to-current converter is formed.

The operation of the voltage-to-current converter in FIG. 9 will be described.

A current equal to the sum of currents corresponding to input voltages to the positive phase input terminals in3 and in4 flows in the source-to-drain path of the transistor M10. The transistors M10 and Mn comprises a current mirror, and hence a current flowing in the source-to-drain path of the transistor M11 is controlled by the positive phase input terminals in3 and in4. Likewise, a current flowing between the source and drain of the transistor M12 is controlled by the positive phase input terminals in3 and in4. That is, the transistors M11 and M12 serve as variable current sources controlled by the positive phase input terminals in3 and in4.

In the voltage-to-current converter in FIG. 9, therefore, since the constant current sources J1 and J2 in FIG. 8 are replaced with the transistors M11 and M12 serving as variable current sources, each of output currents from the positive phase output terminals out1 and out2 is equal to the current obtained by subtracting the sum of currents corresponding to input voltages to the negative phase input terminals in1 and in2 from a current equal to the sum of currents corresponding to input voltages to the positive phase input terminals in3 and in4.

In the voltage-to-current converter used in the circuit shown in FIG. 1, the positive phase input terminals in3 and in4 shown in FIG. 9 are connected to predetermined potential points and shielded from the outside of the voltage-to-current converter so as not to receive any input from the outside of this converter. The present invention is not limited to this arrangement, and an arrangement in which the positive phase input terminals in3 and in4 can receive inputs from the outside may be used. In this case, as the voltage-to-current converter in FIG. 1, a single-step-amplification voltage-to-current converter with a negative phase two-input/positive phase two-input positive phase two-output is used.

The voltage-to-current converter in FIG. 9 has the arrangement of a common source amplifier in which the number of transistors connected in series between the power lines 91 and 92 is limited to two or less, and hence the maximum value of an output signal amplifier is larger than that in the prior art.

In the voltage-to-current converter in FIG. 9, letting Vsat be the saturation voltage of each transistor, and Vt be a threshold voltage, a maximum value Vmax of an output signal amplitude is equal to the value obtained by subtracting the drain-to-source voltage of the transistors M8 and M12 and Vss from an operating voltage Vdd. Therefore, Vmax=Vdd−Vsat−Vsat−Vss=Vdd−2sat−Vss.

If, for example, the saturation voltage Vsat of each transistor is 0.2 V; the threshold voltage Vt, 0.5 V; the power supply voltage Vdd, 1.0 V; and Vss, 0V (ground), then Vmax=0.6 V. That is, the maximum value of the output signal amplitude increases as compared with the conventional balanced amplifier comprising a combination of a differential pair and CMFB circuit. It is expected that this amplifier can exhibit sufficient performance even at a voltage lower than that for the conventional balanced amplifier.

Figure 10:
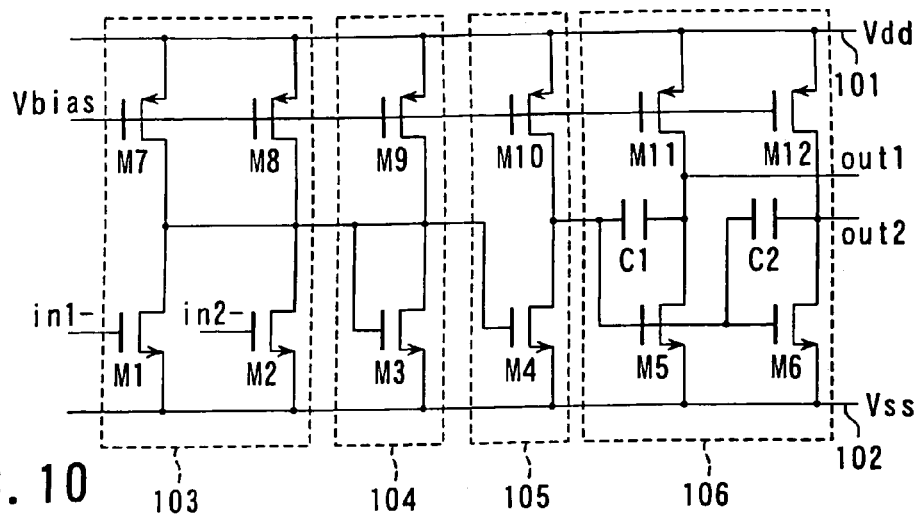
FIG. 10 is a circuit diagram showing an example of the practical arrangement of a voltage-to-current converter when a common source two-stage amplifier is used for each of the voltage-to-current converters Gm1 to Gm3 in FIGS. 1 to 6.

FIG. 10 shows the third practical arrangement example of the voltage-to-current converters Gm1 and Gm2 used in this embodiment. This voltage-to-current converter comprises a power supply line 101 having a potential Vdd, a power supply line 102 having a potential Vss, negative phase input terminals in1 and in2, n-channel transistors M1 to M6, p-channel transistors M7 to M12, capacitors C1 and C2, and positive phase output terminals out1 and out2.

The sources of the transistors M1 to M6 are connected to the power supply line 102, and the sources of the transistors M7 to M12 are connected to the power supply line 101. A common bias voltage is applied to the gates of the transistors M7 to M12. The transistors M7 to M12 function as current sources.

The overall circuit shown in FIG. 10 serves as a voltage-to-current converter having a negative phase two input and positive phase two-output. This circuit can be broken down, in terms of function, into a two-input/one-output voltage-to-current converter 103, one-input/one-output current-to-voltage converter 104, one-input/one-output amplifier 105, and one-input/two-output amplifier 106.

Two input signals input to the negative phase input terminals in1 and in2 are input to the voltage-to-current converter 103 and become two final output signals upon sequentially passing through the one-input/one-output current-to-voltage converter 104, one-input/one-output amplifier 105, and one-input/two-output amplifier 106. These signals are then output from the positive phase output terminals out1 and out2.

The two-input/one-output voltage-to-current converter 103 comprises transistors M1, M2, M7, and M8. The drains of these four transistors are mutually connected. Signals are output from the line which connects the drains to a circuit on the output stage.

The one-input/one-output current-to-voltage converter 104 comprises the transistors M3 and M9. The gate and drain of the transistor M3 and the drain of the transistor M9 are connected to each other. Signals are received on this connecting line from the circuit on the input side and output to the circuit on the output stage.

The one-input/one-output amplifier 105 is comprised of transistors M4 and M10. A signal is input from the circuit on the input side to the gate of the transistor M4. The drains of the transistors M4 and M10 are connected to each other. Signals are output from this connecting line to the circuit on the output stage.

The one-input/two-output amplifier 106 is comprised of the transistors M5, M6, M11, and M12 and the capacitors C1 and C2. The gates of the transistors M5 and M6 are connected to each other. Signals from the circuit on the input side are input on this connecting line. The drains of the transistors M5 and M11 are connected to each other. The positive phase output terminal out1 is connected to this connecting line. Likewise, the drains of the transistors M6 and M12 are connected to each other. The positive phase output terminal out2 is connected to this connecting line.

The gates and drains of the transistors M5 and M6 are connected through the capacitors C1 and C2 for phase compensation.

The voltage-to-current converters Gm1 and Gm2 used in the circuit in FIG. 1 are formed by using the transistors M7 to M12 serving as constant current sources. A gate voltage Vbias is applied from a constant power supply line to the transistors M7 to M12 in FIG. 10. However, the voltage-to-current converters Gm1 and Gm2 are not limited to this circuit arrangement and may have a bias circuit and positive phase input terminals in3 and in4 in addition to the components of the circuit in FIG. 10. This circuit may be designed to control a bias circuit for applying Vbias upon reception of inputs from the outside of the positive phase input terminals in3 and in4. In this case, as the voltage-to-current converter in FIG. 1, a two-step-amplification voltage-to-current converter with a negative phase two-input/positive phase two-input/positive phase two-output is used.

Since the voltage-to-current converter in FIG. 10 has a common source amplifier arrangement in which the number of cascaded transistors between the power supply lines 101 and 102 is limited to two or less, the maximum value of an output signal amplitude is larger than that in the prior art. In addition, since the voltage-to-current converter has two amplifiers, the transconductance of the voltage-to-current converter can be increased.

In the voltage-to-current converter in FIG. 10, letting Vsat be the saturation voltage of each transistor and Vt be a threshold voltage, a maximum value Vmax of an output signal amplitude is equal to the value obtained by subtracting the drain-to-source voltage of the transistors M8 and M12 and Vss from an operating voltage Vdd, i.e., Vmax=Vdd−Vsat−Vsat−Vss=Vdd—2sat−Vss.

If, for example, the saturation voltage Vsat of each transistor is 0.2 V; the threshold voltage Vt, 0.5 V; power supply voltage Vdd, 1.0V; and Vss, 0V (ground), then Vmax=0.6 V. That is, the maximum value of the output signal amplitude increases as compared with the conventional balanced amplifier comprising a combination of a differential pair and CMFB circuit. It is expected that this amplifier can exhibit sufficient performance even at a voltage lower than that for the conventional balanced amplifier.

SECOND EMBODIMENT

Figure 2:
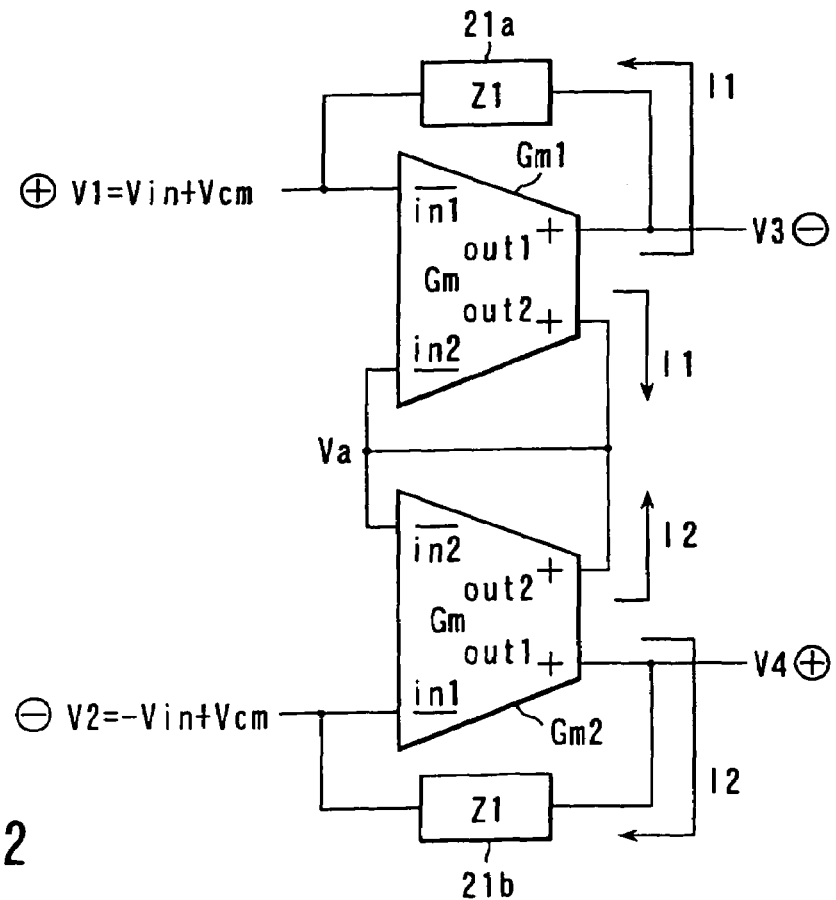
FIG. 2 is a block diagram of a balanced amplifier according to the second embodiment of the present invention.

FIG. 2 is a block diagram showing a balanced amplifier according to the second embodiment of the present invention. This balanced amplifier is a voltage-input/voltage-output balanced amplifier comprised of voltage-to-current converters Gm1 and Gm2 each having four terminals, namely negative phase input terminals in1 and in2 and positive phase output terminals out1 and out2, an impedance element 21a connected in parallel between the negative phase input terminal in1 and positive phase output terminal out1 of the voltage-to-current converter Gm1, and an impedance element 21b connected in parallel between the negative phase input terminal in1 and positive phase output terminal out1 of the voltage-to-current converter Gm2. The four terminals, i.e., negative phase input terminals in2 and positive phase output terminals out2 of the voltage-to-current converters Gm1 and Gm2 are connected to each other.

The operation of the balanced amplifier according to this embodiment will be described next. For the sake of simple explanation, assume that the currents output from the positive phase output terminals out1 and out2 of the voltage-to-current converters Gm1 and Gm2 are always equal.

Let V1 be the input voltage to the voltage-to-current converter Gm1, V2 be the input voltage to the voltage-to-current converter Gm2, 2Vin be the differential component of the input voltage, Vcm be the common-mode component, Gm be the transconductance of each of the voltage-to-current converters Gm1 and Gm2, Z1 be the impedance of each of the impedance elements 21a and 21b, V3 be the output voltage from the positive phase output terminal out1 of the voltage-to-current converter Gm1, V4 be the output voltage from the positive phase output terminal out1 of the voltage-to-current converter Gm2, I1 be the output current from each of the positive phase output terminals out1 and out2 of the voltage-to-current converter Gm1, I2 be the output current from the positive phase output terminals out1 and out2 of the voltage-to-current converter Gm2, and Va be the potential of a line connecting the terminals out2 and in2 of the voltage-to-current converters Gm1 and Gm2.

The voltage-to-current converters Gm1 and Gm2 convert input voltages into currents and output them. The relationships between the input voltages and the output currents are represented by I1=−Gm(V1+Va) and I2=−Gm(V2+Va). Since the balanced amplifier of this embodiment is generally used to output an output signal to a circuit having a high input impedance, such as a buffer circuit, all output currents are fed back as long as the amplifier is used in a general manner. Therefore, V3=V1+I1·Z1 and V4=V2+I2·Z1. Since the currents output to the positive phase output terminals out2 of the voltage-to-current converters Gm1 and Gm2 cannot flow into either negative phase input terminal in2, I1+I2=0. Since V1=Vin+Vcm and V2=−Vin+Vcm, Va, V3, and V4 are calculated as Va=−Vcm, V3=Vcm−Vin−Gm·Z1·Vin, and V4= Vcm−Vin+Gm·Z1·Vin.

In general, since a high differential voltage gain is set (Gm·Z1 >>1 in this embodiment), V3 to Vcm−Gm·Z1·Vin and V4 to Vcm+Gm·Z1·Vin. That is, the input differential voltage is multiplied by Gm·Z1, and the input common-mode voltage appears at the output without any change. Since a common-mode rejection ratio (to be referred to as a CMRR) is defined by (differential voltage gain)/(common-mode voltage gain), the CMRR of the circuit of this embodiment is represented by Gm·Z1. Since Gm·Z1 >>1, a high CMRR can be obtained.

In this embodiment, as the voltage-to-current converters Gm1 and Gm2, for example, the circuits shown in FIGS. 8 to 10 may be used. The negative phase input terminals in the voltage-to-current converter in FIG. 9 are handled in the above manner. This circuit is used as a negative phase two-input/positive phase two-output voltage-to-current converter. However, the present invention is not limited to this For example, as the voltage-to-current converters Gm1 and Gm2 in this embodiment, the above circuit in FIG. 9 formed as a negative phase two-input/positive phase two-input positive phase two-output voltage-to-current converter may be used.

As described above, by using these voltage-to-current converters, a high output amplitude limit can be obtained even in low-voltage operation as compared with a conventional balanced amplifier comprising a combination of a differential pair and CMFB circuit. In addition, the circuit in FIG. 10 can increase the transconductance Gm as compared with the circuits shown in FIGS. 8 and 9, the CMRR can be increased as compared with a case wherein the circuits shown in FIGS. 8 and 9 are used.

The advantages of this embodiment are that a considerably high CMRR corresponding to the gain of an amplifier can be obtained, and a high output signal amplitude limit can be obtained in low-voltage operation as compared with the prior art.

THIRD EMBODIMENT

Figure 3:
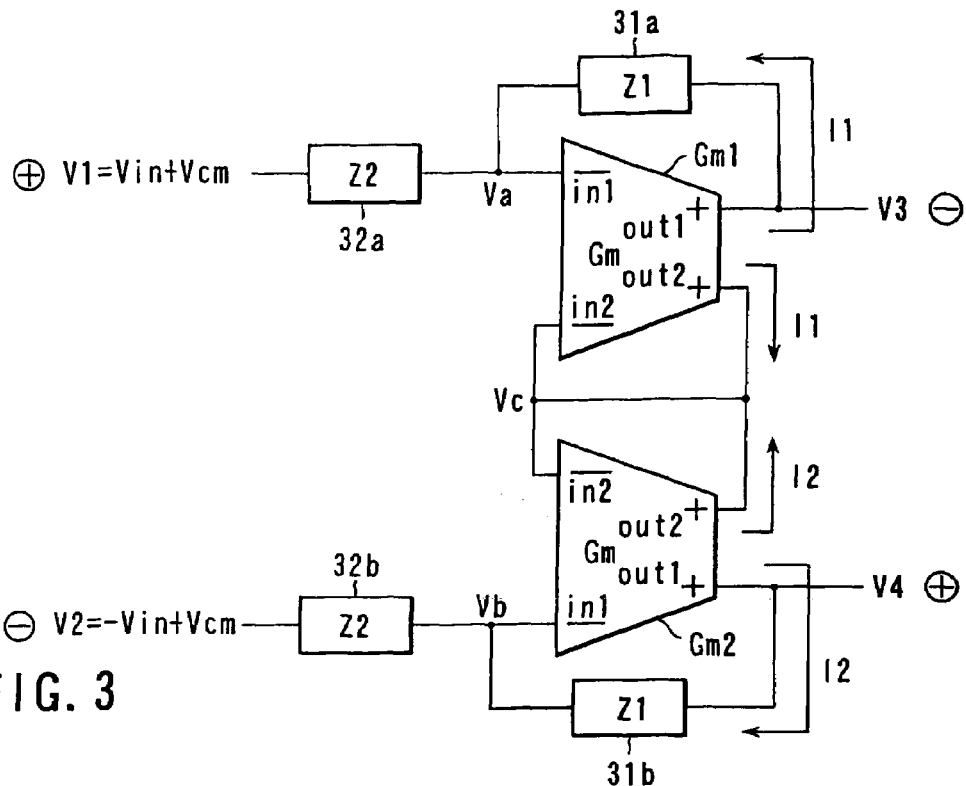
FIG. 3 is a block diagram of a balanced amplifier according to the third embodiment of the present invention.

FIG. 3 is a block diagram showing a balanced amplifier according to the third embodiment of the present invention. This balanced amplifier is a voltage-input/voltage-output balanced amplifier comprised of voltage-to-current converters Gm1 and Gm2 each having four terminals, namely negative phase input terminals in1 and in2 and positive phase output terminals out1 and out2, an impedance element 31a connected in parallel between the negative phase input terminal in1 and positive phase output terminal out1 of the voltage-to-current converter Gm1, an impedance element 31b connected in parallel between the negative phase input terminal in1 and positive phase output terminal out1 of the voltage-to-current converter Gm2, an impedance element 32a having one terminal connected to the negative phase input terminal in1 of the voltage-to-current converter Gm1, and an impedance element 32b having one terminal connected to the negative phase input terminal in1 of the voltage-to-current converter Gm2. The negative phase input terminals in2 and positive phase output terminals out2 of the voltage-to-current converters Gm1 and Gm2 are connected to each other.

The operation of the balanced amplifier according to this embodiment will be described next. For the sake of simple explanation, assume that the currents output from the positive phase output terminals out1 and out2 of the voltage-to-current converters Gm1 and Gm2 are always equal. In practice, however, these output currents may differ from each other.

Let V1 be the input voltage to the impedance element 32a side of the balanced amplifier according to this embodiment, V2 be the input voltage to the impedance element 32b side, 2Vin be the differential component of the input voltages, Vcm be the common-mode component, Gm be the transconductance of each of the voltage-to-current converters Gm1 and Gm2, Z1 be the impedance of each of the impedance elements 31a and 31b, Z2 be the impedance of each of the impedance elements 32a and 32b, V3 be the output voltage from the positive phase output terminal out1 of the voltage-to-current converter Gm1, V4 be the output voltage from the positive phase output terminal out1 of the voltage-to-current converter Gm2, I1 be the output current from each of the positive phase output terminals out1 and out2 of the voltage-to-current converter Gm1, I2 be the output current from each of the positive phase output terminals out1 and out2 of the voltage-to-current converter Gm2, Va be the potential of a line connecting the negative phase input terminal in1 of the voltage-to-current converter Gm1 and the impedance elements 31a and 32a, Vb be the potential of a line connecting the negative phase input terminal in1 of the voltage-to-current converter Gm2 and the impedance elements 31b and 32b, and Vc be the potential of a line connecting the four terminals out2 and in2 of the voltage-to-current converters Gm1 and Gm2.

The voltage-to-current converters Gm1 and Gm2 convert input voltages into currents. The relationships between the input voltages and the output currents are represented by I1=−Gm(Va+Vc) and I2=−Gm(Vb+Vc). Since the balanced amplifier of this embodiment is generally used to output an output signal to a circuit having a high input impedance, such as a buffer circuit, all output currents are fed back as long as the amplifier is used in a general manner. Therefore, V3=Va+I1·Z1 and V4=Vb+I2·Z1. Since the currents output to the positive phase output terminals out2 of the voltage-to-current converters Gm1 and Gm2 cannot flow into either negative phase input terminal in2, I1+I2=0. Since the impedance of the negative phase input terminal in1 is very high, the current fed back from the positive phase output terminal out1 cannot flow into the negative phase input terminal in1. Therefore, Va=V1+I1·Z2 and Vb=V2+I2·Z2. In addition, since V1=Vin+Vcm and V2=−Vin+Vcm, Va, Vb, Vc, V3, and V4 are given by:

$$Va = \frac{Vin + Vcm + Gm \bullet Z2 \bullet Vcm}{Gm \bullet Z2 + 1}$$

$$Vc = -Vcm$$

$$V3 = \frac{Vin + Vcm - GM \bullet Z1 \bullet Vin + Gm \bullet Z2 \bullet Vcm}{Gm \bullet Z2 + 1}$$

$$V4 = \frac{-Vin + Vcm + Gm \bullet Z1 \bullet Vin + Gm \bullet Z2 \bullet Vcm}{Gm \bullet Z2 + 1}$$

In this case, if Gm·Z1>>1 and Gm·Z2>>1, minute terms can be neglected, and the above values can be expressed as:

$$Va \cong Vcm$$

$$Vb \cong Vcm$$

$$Vc \cong -Vcm$$

$$V3 \cong Vcm - \frac{Z1}{Z2} Vin$$

$$V4 \cong Vcm + \frac{Z1}{Z2} Vin$$

Obviously, therefore, the input differential voltage is multiplied by Z1/Z2, but the input common-mode voltage appears at the output without any change. Since the CMRR of the circuit according to this embodiment becomes Z1/Z2, and the circuit is generally designed to set the differential voltage gain to (Z1/Z2)>>1, a high CMRR can be obtained. In addition, since the differential voltage gain is determined by the magnitudes of Z1 and Z2, even if the transconductance Gm varies due to changes in temperature or time-varying factors, the differential voltage gain can be kept constant.

In this embodiment, as the voltage-to-current converters Gm1 and Gm2, for example, the circuits shown in FIGS. 8 to 10 may be used. The negative phase input terminals in the voltage-to-current converter in FIG. 9 are handled in the above manner. This circuit is used as a negative phase two-input/positive phase two-output voltage-to-current converter. However, the present invention is not limited to this. For example, as the voltage-to-current converters Gm1 and Gm2 in this embodiment, the above circuit in FIG. 9 or 10 formed as a negative phase two-input/positive phase two-input positive phase two-output voltage-to-current converter may be used. By using these circuits as the voltage-to-current converters Gm1 and Gm2, the maximum value of an output signal amplitude increases as compared with the conventional balanced amplifier obtained by combining the differential pair and the CMFB circuit.

The advantages of this embodiment are that a CMRR equivalent in magnitude to the gain of an amplifier can be obtained, a CMRR can be determined by a relatively stable value, i.e., the ratio between the impedance values of impedance elements and is not dependent on a value that tends to vary, e.g., a transconductance value, and a high output signal amplitude can be obtained even at a low operating voltage if the circuits shown in FIGS. 8 to 10 are used as the voltage-to-current converters Gm1 and Gm2.

FOURTH EMBODIMENT

Figure 4:
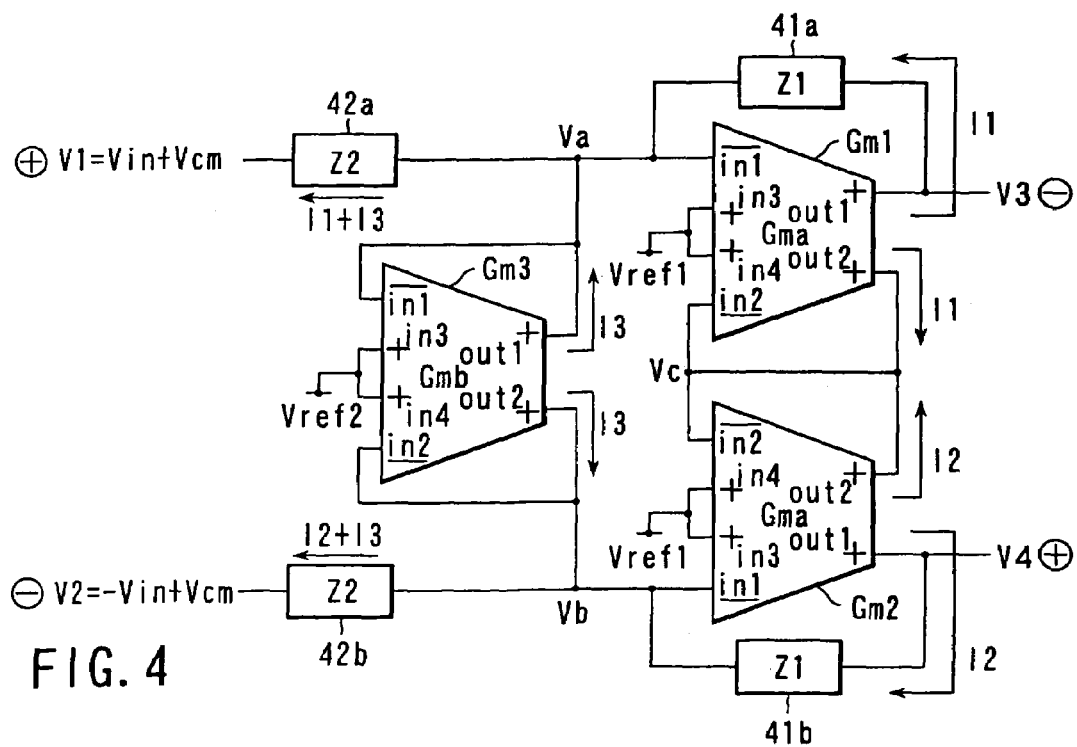
FIG. 4 is a block diagram of a balanced amplifier according to the fourth embodiment of the present invention.

FIG. 4 is a block diagram of a balanced amplifier according to the fourth embodiment of the present invention. This balanced amplifier is a voltage-input voltage-output balanced amplifier comprising voltage-to-current converters Gm1, Gm2, and Gm3, each having negative phase input terminals in1 and in2, positive phase input terminals in3 and in4, and positive phase output terminals out1 and out2, an impedance element 41a connected in parallel between the negative phase input terminal in1 and positive phase output terminal out1 of the voltage-to-current converter Gm1, an impedance element 41b connected in parallel between the negative phase input terminal in1 and positive phase output terminal out1 of the voltage-to-current converter Gm2, an impedance element 42a having one terminal connected between the negative phase input terminal in1 of the voltage-to-current converter Gm1 and the impedance element 41a, and an impedance element 42b having one terminal connected between the negative phase input terminal in1 of the voltage-to-current converter Gm2 and the impedance element 41b. The positive phase input terminals in3 and in4 of the voltage-to-current converters Gm1 and Gm2 are connected to a common potential. The four terminals, i.e., the negative phase input terminals in2 and positive phase output terminals out2, of the voltage-to-current converters Gm1 and Gm2 are connected to each other. The negative phase input terminal in1 and positive phase output terminal out1 of the voltage-to-current converter Gm3 are connected to the negative phase input terminal in1 of the voltage-to-current converter Gm1. The negative phase input terminal in2 and positive phase output terminal out2 of the voltage-to-current converter Gm3 are connected to the negative phase input terminal in1 of the voltage-to-current converter Gm2. The positive phase input terminals in3 and in4 of the voltage-to-current converter Gm3 are connected to a common potential.

The operation of the balanced amplifier according to this embodiment will be described next. For the sake of simple explanation, assume that the currents output from the positive phase output terminals out1 and out2 of the voltage-to-current converters Gm1 and Gm2 are always equal. This also applies to the voltage-to-current converters Gm2 and Gm3. However, output currents from the voltage-to-current converters Gm1 and Gm2 need not be equal.

Let V1 be the input voltage to the impedance element 42a side of the balanced amplifier according to this embodiment, V2 be the input voltage to the impedance element 42a side, 2Vin be a differential component of the input voltage, Vcm be the common-mode component, Gma be the transconductance of each of the voltage-to-current converters Gm1 and Gm2, Gmb be the transconductance of the voltage-to-current converter Gm3, Z1 be the impedance of each of the impedance elements 41a and 41b, Z2 be the impedance of each of the impedance elements 42a and 42b, V3 be the output voltage from the positive phase output terminal out1 of the voltage-to-current converter Gm1, V4 be the output voltage from the positive phase output terminal out1 of the voltage-to-current converter Gm2, I1 be the output current from each of the positive phase output terminals out1 and out2 of the voltage-to-current converter Gm1, I2 be the output current from each of the positive phase output terminals out1 and out2 of the voltage-to-current converter Gm2, I3 be the output current from each of the positive phase output terminals out1 and out2 of the voltage-to-current converter Gm3, Va be the potential of the negative phase input terminal in1 of the voltage-to-current converter Gm1, Vb be the potential of the negative phase input terminal in1 of the voltage-to-current converter Gm2, Vc be the potential of each of the negative phase input terminals in2 of the voltage-to-current converters Gm1 and Gm2, Vref1 be the reference voltage input to each of the positive phase input terminals in3 and in4 of the voltage-to-current converters Gm1 and Gm2, and Vref2 be the reference voltage input to each of the positive phase input terminals in3 and in4 of the voltage-to-current converter Gm3.

The voltage-to-current converters Gm1, Gm2, and Gm3 convert input voltages into currents and output them. The relationships between the input voltages and the output currents are represented by I1=Gma(2Vref1−Va−Vc), I2=Gma(2Vref1−Vb−Vc), and I3=Gmb(2Vref2−Va−Vb). Since the balanced amplifier of this embodiment is generally used to output an output signal to a circuit having a high input impedance, such as a buffer circuit, all output currents are fed back as long as the amplifier is used in a general manner. Therefore, V3=Va+I1·Z1 and V4=Vb+I2·Z1. Since the currents output to the positive phase output terminals out2 of the voltage-to-current converters Gm1 and Gm2 cannot flow into either negative phase input terminal in2, I1+I2=0. Since the impedances of the negative phase input terminals in1 and in2 of the voltage-to-current converter Gm3 are very high, no current can flow into them. Therefore, Va=V1+(I1+I3)Z2 and Vb=V2+ (I2+I3)Z2. Differential input signals to the balanced amplifier according to this embodiment are represented by V1=Vin+Vcm and V2=Vin+Vcm.

According to the above description, Va, Vb, Vc, V3, and V4 are given by:

$$Va = \frac{Vin + 2Gmb \bullet Z2 \bullet Vin}{(Gma \bullet Z2 + 1)(2Gmb \bullet Z2 + 1)} + \frac{Vcm + Vcm \bullet Gma \bullet Z2}{(Gma \bullet Z2 + 1)(2Gmb \bullet Z2 + 1)} +$$
$$\frac{2Gma \bullet Gmb \bullet Z2^2 \bullet Vref2 + 2Gmb \bullet Z2 \bullet Vref2}{(Gma \bullet Z2 + 1)(2Gmb \bullet Z2 + 1)}$$

$$Vb = \frac{-Vin - 2Gmb \bullet Z2 \bullet Vin}{(Gma \bullet Z2 + 1)(2Gmb \bullet Z2 + 1)} + \frac{Vcm + Vcm \bullet Gma \bullet Z2}{(Gma \bullet Z2 + 1)(2Gmb \bullet Z2 + 1)} +$$
$$\frac{2Gma \bullet Gmb \bullet Z2^2 \bullet Vref2 + 2Gmb \bullet Z2 \bullet Vref2}{(Gma \bullet Z2 + 1)(2Gmb \bullet Z2 + 1)}$$

$$Vc = \frac{2Vref + 4Gmb \bullet Z2 \bullet Vref1}{2Gma \bullet Z2 + 1} - \frac{Vin}{2Gma \bullet Z2 + 1} - \frac{2Gmb \bullet Z2^2 \bullet Vref2}{2Gma \bullet Z2 + 1}$$

$$V3 = \frac{Vin + 2Gmb \bullet Z2 \bullet Vin - Gma \bullet Z1 \bullet Vin - 2Gma \bullet Gmb \bullet Z1 \bullet Z2 \bullet Vin}{(Gma \bullet Z2 + 1)(2Gmb \bullet Z2 + 1)} +$$
$$\frac{Vcm + Z2 \bullet Gma \bullet Vcm}{(Gma \bullet Z2 + 1)(2Gmb \bullet Z2 + 1)} +$$
$$\frac{2Gma \bullet Gmb \bullet Z2^2 \bullet Vref2 + 2Gmb \bullet Z2 \bullet Vref2}{(Gma \bullet Z2 + 1)(2Gmb \bullet Z2 + 1)}$$

$$V4 = \frac{-Vin - 2Gmb \bullet Z2 \bullet Vin + Gma \bullet Z1 \bullet Vin + 2Gma \bullet Gmb \bullet Z1 \bullet Z2 \bullet Vin}{(Gma \bullet Z2 + 1)(2Gmb \bullet Z2 + 1)} +$$
$$\frac{Vcm + Z2 \bullet Gma \bullet Vcm}{(Gma \bullet Z2 + 1)(2Gmb \bullet Z2 + 1)} +$$
$$\frac{2Gma \bullet Gmb \bullet Z2^2 \bullet Vref2 + 2Gmb \bullet Z2 \bullet Vref2}{(Gma \bullet Z2 + 1)(2Gmb \bullet Z2 + 1)}$$

In this case, if Gma·Z1>>1, Gmb·Z2 >>1, and Gma·Z2 >>1, and minute terms are neglected, the above values can be expressed as:

$$Va \cong Vref2$$

$$Vb \cong Vref2$$

$$Vc \cong 2Vref1 - Vref2$$

$$V3 = -\frac{Z1}{Z2}Vin + \frac{1}{2Gmb \bullet Z2}Vcm + Vref2 = -\frac{Z1}{Z2}Vin + Vref2$$

$$V4 = -\frac{Z1}{Z2}Vin + \frac{1}{2Gmb \bullet Z2}Vcm + Vref2 = \frac{Z1}{Z2}Vin + Vref2$$

Obviously, a differential gain is multiplied by Z1/Z2 and determined by impedance elements but is not influenced by variations in transconductance Gm. In addition, since a common-mode output voltage is equal to the reference voltage Vref2 input to the positive phase input terminals in3 and in4 of the voltage-to-current converter Gm3, the input voltage Vref to the positive phase input terminals in3 and in4 of the voltage-to-current converter Gm3 becomes a bias voltage that controls the common-mode output voltage. If, for example, Vref2 is 0.7V, the common-mode component of the output voltage also becomes 0.7 V.

In this case, if Vref1=Vref2=Vref, then Va=Vb=Vc=Vref. Since input voltages to all the voltage-to-current converters become equal to each other, the paths between the input terminals in1, in2, in3, and in4 of all the voltage-to-current converters can be regarded as virtual shorts. This makes it possible to form each of the voltage-to-current converters Gm1, Gm2, and Gm3 by using transistors with narrow linear input ranges as transistors which receive input signals.

As each of the voltage-to-current converters Gm1, Gm2, and Gm3, the circuit shown in FIG. 9 can be used. A circuit obtained by adding a circuit capable of controlling bias voltages to be applied to the transistors M7 to M12 by using input voltages to the positive phase input terminals in3 and in4 to the voltage-to-current converter in FIG. 10 may be used as each of the voltage-to-current converters Gm1 to Gm3 according to this embodiment.

The advantages of this embodiment are that a differential gain can be determined by a relatively stable value, i.e., an impedance value ratio, an output voltage operating point can be determined by the voltage externally applied to each positive phase input terminal, and a high output signal amplitude can be obtained even at a low operating voltage as compared with the prior art.

FIFTH EMBODIMENT

Figure 5:
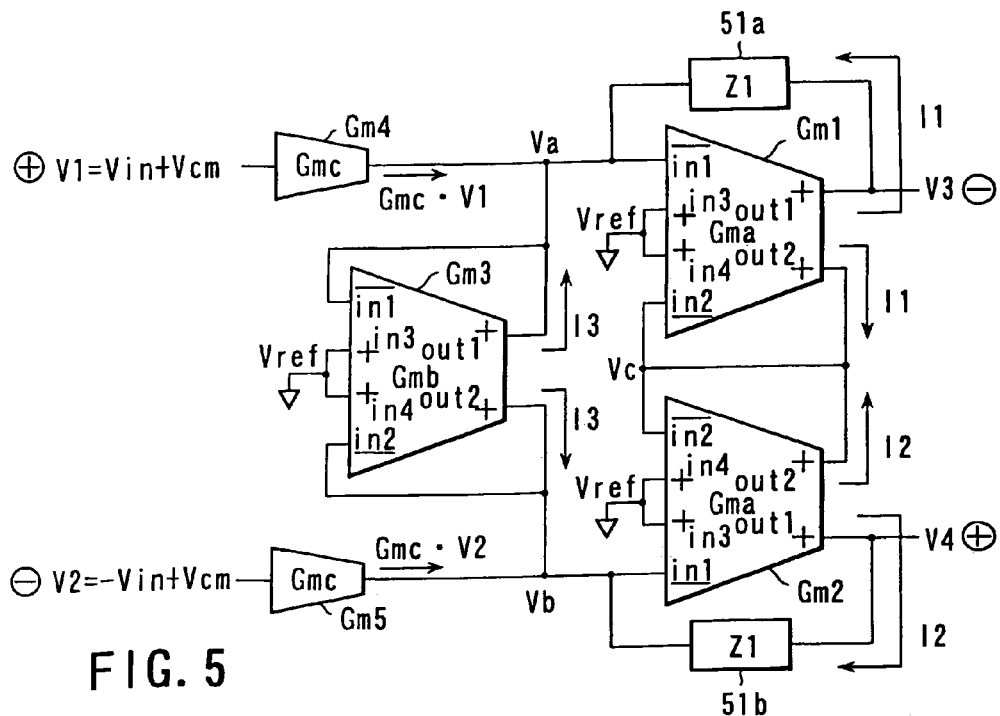
FIG. 5 is a block diagram of a balanced amplifier according to the fifth embodiment of the present invention.

FIG. 5 is a block diagram of a balanced amplifier according to the fifth embodiment of the present invention. Note that a description of a portion common to the fourth embodiment will be omitted.

The balanced amplifier according to this embodiment uses single input/signal output voltage-to-current converters Gm4 and Gm5 instead of the impedance elements 42a and 42b in the fourth embodiment.

The balanced amplifier according to this embodiment is a voltage-input/voltage-output balanced amplifier comprising voltage-to-current converters Gm1, Gm2, and Gm3, each having negative phase input terminals in1 and in2, positive phase input terminals in3 and in4, and positive phase output terminals out1 and out2, an impedance element 51a connected in parallel between the negative phase input terminal in1 and positive phase output terminal out1 of the voltage-to-current converter Gm1, an impedance element 51*b* connected in parallel between the negative phase input terminal in1 and positive phase output terminal out1 of the voltage-to-current converter Gm2, and the single input/single output voltage-to-current converters Gm4 and Gm5.

The positive phase input terminals in3 and in4 of the voltage-to-current converters Gm1, Gm2, and Gm3 are connected to a common potential. The output terminal of the single input/single output voltage-to-current converter Gm4 is connected to the negative phase input terminal in1 of the voltage-to-current converter Gm1. The output terminal of the single input/single output voltage-to-current converter Gm5 is connected to the negative phase input terminal in1 of the voltage-to-current converter Gm2. The four terminals, i.e., the negative phase input terminals in2 and positive phase output terminals out2, of each of the voltage-to-current converters Gm1 and Gm2 are commonly connected. The negative phase input terminal in1 and positive phase output terminal out1 of the voltage-to-current converter Gm3 are connected to the negative phase input terminal in1 of the voltage-to-current converter Gm1. The negative phase input terminal in2 and positive phase output terminal out2 of the voltage-to-current converter Gm3 are connected to the negative phase input terminal in1 of the voltage-to-current converter Gm2. The positive phase input terminals in3 and in4 of each of the voltage-to-current converters Gm1, Gm2, and Gm3 are connected to a common potential.

The operation of the balanced amplifier according to this embodiment will be described next. For the sake of simple explanation, assume that the currents output from the positive phase output terminals out1 and out2 of the voltage-to-current converters Gm1, Gm2, and Gm3 are always equal.

Let V1 be the input voltage to the input terminal of the single input/single output voltage-to-current converter Gm4 of the balanced amplifier according to this embodiment, V2 be the input voltage to the input terminal of the single input/single output voltage-to-current converter Gm5, 2Vin be the differential component of the input voltage, Vcm be the common-mode component, Gma be the transconductance of each of the voltage-to-current converters Gm1 and Gm2, Gmb be the transconductance of the voltage-to-current converter Gm3, Gmc be the transconductance of each of the single input/single output voltage-to-current converters Gm4 and Gm5, Z1 be the impedance of each of the impedance elements 51*a* and 51*b*, V3 be the output voltage from the positive phase output terminal out1 of the voltage-to-current converter Gm1, V4 be the output voltage from the positive phase output terminal out1 of the voltage-to-current converter Gm2, I1 be the output current from each of the positive phase output terminals out1 and out2 of the voltage-to-current converter Gm1, I2 be the output current from each of the positive phase output terminals out1 and out2 of the voltage-to-current converter Gm2, I3 be the output current from the positive phase output terminals out1 and out2 of the voltage-to-current converter Gm3, Va be the potential of the negative phase input terminal in1 of the voltage-to-current converter Gm1, Vb be the potential of the negative phase input terminal in1 of the voltage-to-current converter Gm2, Vc be the potential of each of the negative phase input terminals in2 of the voltage-to-current converters Gm1 and Gm2, and Vref be the bias voltage input to each of the positive phase input terminals in3 and in4 of the voltage-to-current converters Gm1, Gm2, and Gm3.

The voltage-to-current converters Gm1, Gm2, and Gm3 convert input voltages into currents and output them. The relationships between the input voltages and the output currents are represented by I1=Gma(2Vref−Va−Vc), I2=Gma(2Vref−Vb−Vc), and I3=Gmb(2Vref−Va−Vb). Since the balanced amplifier of this embodiment is generally used to output an output signal to a circuit having a high input impedance, such as a buffer circuit, all output currents are fed back as long as the amplifier is used in a general manner. Therefore, V3=Va+I1·Z1 and V4=Vb+I2·Z1. Since the currents output to the positive phase output terminals out2 of the voltage-to-current converters Gm1 and Gm2 cannot flow into either negative phase input terminal in2, I1+I2≅0. Since the impedances of the negative phase input terminals in1 and in2 of the voltage-to-current converters Gm1, Gm2, and Gm3 are very high, no current can flow into them. Therefore, I1+I3+Gmc·V1=0 and I2+I3+Gmc·V2=0. Differential input signals to the balanced amplifier according to this embodiment are represented by V1=Vin+Vcm and V2=−Vin+Vcm.

According to the above description, V3 and V4 are given by:

$$V3 = \frac{Gma \bullet Gmc \bullet Vcm}{2 Gma \bullet Gmb} + \frac{Gma \bullet Gmb \bullet Vref}{Gma \bullet Gmb} +$$
$$\frac{Gma \bullet Gmc \bullet Vin - Gma \bullet Gmb \bullet Gmc \bullet Z1 \bullet Vin}{Gma \bullet Gmb}$$

$$V4 = \frac{Gma \bullet Gmc \bullet Vcm}{2 Gma \bullet Gmb} + \frac{Gma \bullet Gmb \bullet Vref}{Gma \bullet Gmb} -$$
$$\frac{Gma \bullet Gmc \bullet Vin - Gma \bullet Gmb \bullet Gmc \bullet Z1 \bullet Vin}{Gma \bullet Gmb}$$

In this case, if Gma·Z1 >>1 and Gmb·Z1 >>1, minute terms can be neglected, and the above values can be expressed as:

$$V3 \cong \frac{Gmc}{2 Gmb} Vcm - Gmc \bullet Z1 \bullet Vin + Vref$$

$$V4 \cong \frac{Gmc}{2 Gmb} Vcm + Gmc \bullet Z1 \bullet Vin + Vref$$

As a consequence, the CMRR is given by 2Gmb·Z1, and hence a high CMRR can be obtained. Obviously, in this embodiment as well, Vref serves as a bias voltage for controlling a common-mode output voltage.

Figure 7:
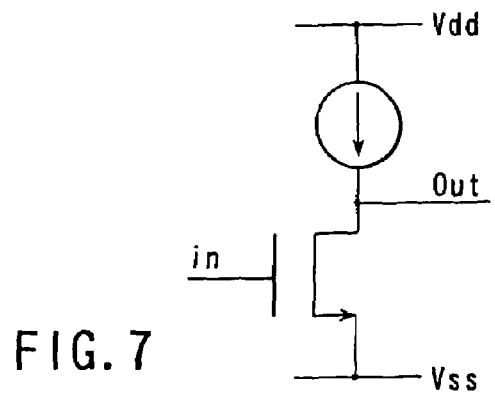
FIG. 7 is a circuit diagram showing an example of a single input/single output voltage-to-current converter in FIG. 5.

As each of the single input/single output voltage-to-current converters Gm4 and Gm5 in this embodiment, for example, a common source transistor circuit like the one shown in FIG. 7 can be used, and hence can be formed by using a very simple circuit.

As each of the voltage-to-current converters Gm1, Gm2, and Gm3 in this embodiment, the circuit shown in FIG. 9 can be used. A circuit obtained by adding a circuit capable of controlling bias voltages to be applied to the transistors M7 to M12 by using input voltages to the positive phase input terminals in3 and in4 to the voltage-to-current converter in FIG. 10 may be used as each of the voltage-to-current converters Gm1 to Gm3 according to this embodiment.

An advantage of this embodiment is that when a filter is formed by using this balanced amplifier as described later, the frequency characteristics of the filter can be easily controlled by changing the value of Gmc, e.g., the common-mode component Vcm of each input voltage. The common-mode component Vcm of an input voltage may be changed by the following method. For example, another balanced amplifier according to this embodiment is connected to the input stage of the balanced amplifier of this embodiment, and the bias voltage to be applied to the balanced amplifier on the input stage is changed. With this operation, since the common-mode output voltage Vcm from the input state also changes, and hence the inphase input voltage Vcm of the balanced amplifier on the output stage changes. As a consequence, the value of Gmc of the balanced amplifier on the output stage changes.

SIXTH EMBODIMENT

Figure 6:
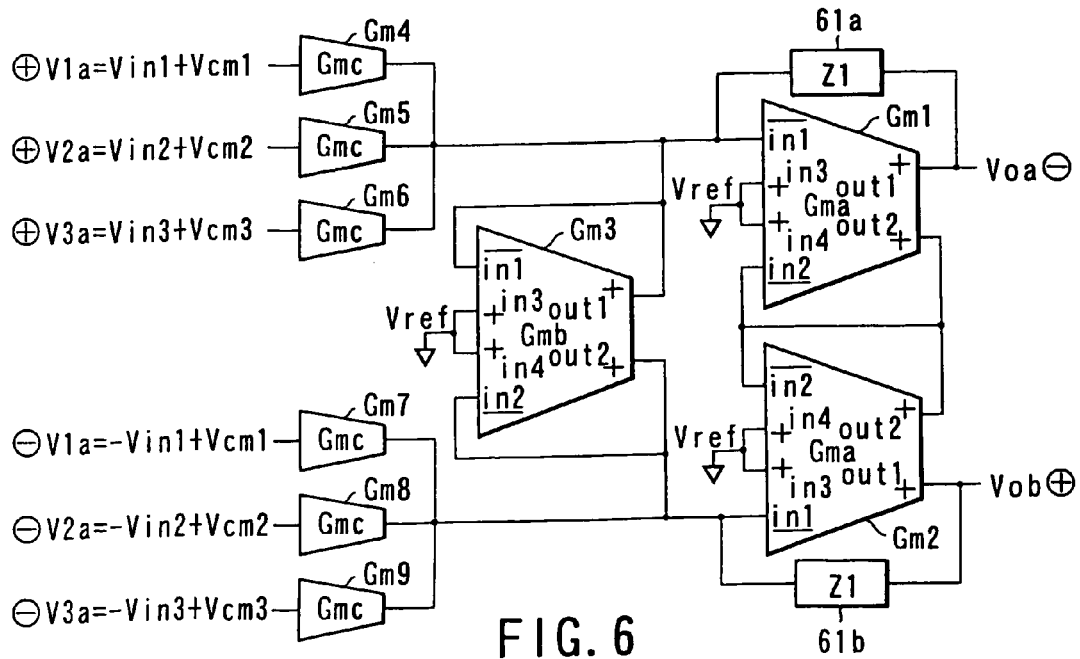
FIG. 6 is a block diagram of a balanced amplifier according to the sixth embodiment of the present invention.

FIG. 6 is a block diagram showing a balanced amplifier according to the sixth embodiment of the present invention. Note that a description of a portion common to the fifth embodiment will be omitted.

The balanced amplifier according to this embodiment has two sets of three single input/single output voltage-to-current converters, which correspond to the single input/single output voltage-to-current converters Gm4 an Gm5 of the balanced amplifier according to the fifth embodiment, thus having inputs of six systems. The balanced amplifier according to this embodiment is a voltage-input/voltage-output balanced amplifier comprising voltage-to-current converters Gm1, Gm2, and Gm3, each having negative phase input terminals in1 and in2, positive phase input terminals in3 and in4, and positive phase output terminals out1 and out2, an impedance element 61a connected in parallel between the negative phase input terminal in1 and positive phase output terminal out1 of the voltage-to-current converter Gm1, an impedance element 61b connected in parallel between the negative phase input terminal in1 and positive phase output terminal out1 of the voltage-to-current converter Gm2, and single input/single output voltage-to-current converters Gm4 to Gm9.

The positive phase input terminals in3 and in4 of the voltage-to-current converters Gm1, Gm2, and Gm3 are connected to a common potential. The output terminals of the single input/single output voltage-to-current converters Gm4, Gm5, and Gm6 are connected to the negative phase input terminal in1 of the voltage-to-current converter Gm1. The output terminals of the single input/single output voltage-to-current converters Gm7, Gm8, and Gm9 are connected to the negative phase input terminal in1 of the voltage-to-current converter Gm2. The four terminals, i.e., the negative phase input terminals in2 and positive phase output terminals out2, of each of the voltage-to-current converters Gm1 and Gm2 are commonly connected. The negative phase input terminal in1 and positive phase output terminal out1 of the voltage-to-current converter Gm3 are connected to the negative phase input terminal in1 of the voltage-to-current converter Gm1. The negative phase input terminal in2 and positive phase output terminal out2 of the voltage-to-current converter Gm3 are connected to the negative phase input terminal in1 of the voltage-to-current converter Gm2. The positive phase input terminals in3 and in4 of each of the voltage-to-current converters Gm1, Gm2, and Gm3 are connected to a common potential. The transconductances of the single input/single output voltage-to-current converters Gm4 to Gm9 are equal to each other.

The operation of the balanced amplifier according to this embodiment will be described next. A description of an operation common to the balanced amplifier of the fifth embodiment will be omitted. In the voltage-to-current converters in this embodiment, the first differential input signal is input to input voltage terminals V1a and V1b of the single input/single output voltage-to-current converters Gm4 and Gm7, the second differential input signal is input to input voltage terminals V2a and V2b of the single input/single output voltage-to-current converters Gm5 and Gm8, and the third differential input signal is input to input voltage terminals V3a and V3b of the single input/single output voltage-to-current converters Gm6 and Gm9. That is, the sum of the three differential input signals can be obtained. This circuit operates in the same manner as the circuit according to the fifth embodiment except that the sum of the three differential input signals is obtained, and outputs a differential output signal corresponding to the sum of the three differential input signals.

In this embodiment, three differential input signals are received. However, an arrangement designed to receive more input signals can be easily realized by increasing the number of single input/single output voltage-to-current converters in the same manner as in this embodiment.

For the sake of simple explanation, it is assumed that all the transconductances of the single input/single output voltage-to-current converters Gm4 to Gm9 are equal. In practice, however, these values may differ from each other. If, for example, the transconductances of the single input/single output voltage-to-current converters Gm4 and Gm7 to which the first differential input signal is input are set to be higher than those of the remaining converters, the gain can be increased only for the differential component of the first differential input signal relative to the differential-mode components of the remaining differential input signals.

In this embodiment, the numbers of single input/single output voltage-to-current converters connected to the voltage-to-current converters Gm1 and Gm2 are set to be equal. However, these numbers need not always be equal.

This embodiment may use impedance elements instead of the single input/single output voltage-to-current converters Gm4 to Gm9 as in the fifth embodiment which uses the single input/single output voltage-to-current converters Gm4 and Gm5 instead of the impedance elements 42a and 42b (see FIG. 4) in the fourth embodiment. In this case, like the above transconductances, the impedances of the respective impedance elements need not be equal.

In addition to the advantages of the fifth embodiment, this embodiment has the advantage that a multi-input type balanced amplifier can be provided.

SEVENTH EMBODIMENT

Figure 11:
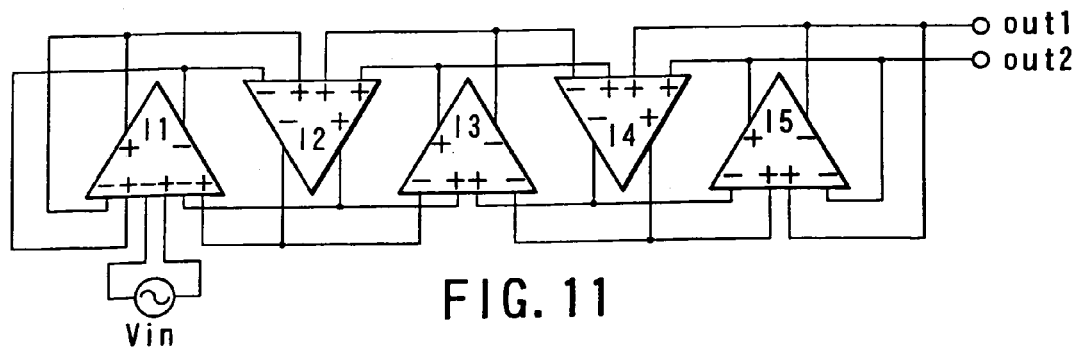
FIG. 11 is a block diagram of a fifth-order leapfrog filter to which the balanced amplifier according to the seventh embodiment of the present invention is applied.

FIG. 11 is a block diagram showing a filter to which a balanced amplifier according to an embodiment of the present invention is applied.

The filter of this embodiment is a fifth-order leapfrog filter and comprises multi-input integrators 11 to 15. These multi-input integrators 11 to 15 use capacitors as the impedance elements 61a and 61b (see FIG. 6) in the sixth embodiment of the present invention. Even if multi-input integrators are required as in this embodiment, a filter that operates at a low voltage and has a high output signal amplitude can be realized by using the balanced amplifier of the present invention.

Since the circuit shown in FIG. 6 is used for each of the integrators 11 to 15 in this embodiment, a transconductance Gmc of each single input/single output voltage-to-current converter in FIG. 6 can be changed by changing the common-mode voltage of an input signal. In addition, since the time constant, i.e., the frequency characteristic, of the filter circuit of this embodiment changes in accordance with the value of Gmc, the frequency characteristic of the filter can be changed by changing the common-mode component of an input signal.

As described above, the common-mode component of an output voltage from the balanced amplifier (FIG. 6) used for the integrators 11 to 15 is determined by the input voltage Vref to all the positive phase input terminals in3 and in4 of the voltage-to-current converters Gm1 to Gm3. The common-mode component of the output voltage becomes substantially equal to Vref.

As the value of Vref changes, the output common-mode voltage changes. Since the outputs and inputs of the integrators 11 to 15 are connected to each other, if Vref increases, the input common-mode voltage increases, and thus the value of Gmc increases. As a consequence, the time constant of the filter circuit in FIG. 11 also changes. The frequency characteristics such as a cutoff frequency, can be changed by changing Vref in the overall circuit.

This embodiment is based on a low pass filter (to be referred to as an LPF). However, the filter circuit using the balanced amplifier of the present invention is not limited to this, and a high pass filter (to be referred to as an HPF) and a band pass filter (to be referred to as a BPF) can be formed by changing the arrangement of the filter circuit.

The filter of this embodiment uses a leapfrog arrangement. However, the filter circuit using the balanced amplifier of the present invention is not limited to this. With regard to the characteristics of the filter as well, circuits having various characteristics, e.g., Butterworth, Chebychev, and Bessel filters, can be assembled by changing the characteristics of the integrators used in this embodiment.

Figure 12:
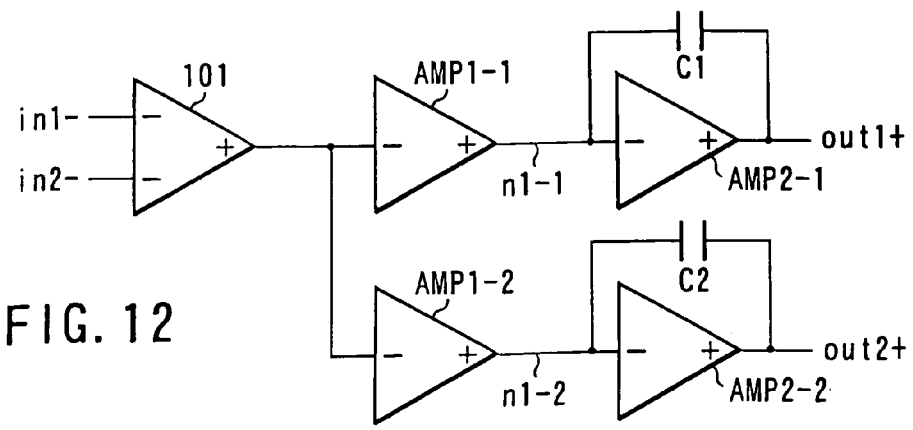
FIG. 12 is a block diagram of a voltage-to-current converter according to the eighth embodiment of the present invention.

FIG. 12 is a block diagram showing a voltage-to-current converter according to the eighth embodiment of the present invention. The voltage-to-current converter comprises an input adder 201, a pair of first stage inverting adders AMP1-1 and AMP-2, and a pair of second stage inverting adders AMP2-1 and AMP2-2. The inverting input terminals of the input adder 201 are connected to input terminals in1 and in2, respectively. The output terminal of the input adder 201 is connected to the inverting input terminals of the first-stage inverting amplifiers AMP-1 and AMP1-2. The non-inverting terminals of the first stage inverting amplifiers AMP2-1 and AMP-2 are connected to the inverting input terminals of the second-stage inverting amplifiers AMP2-1 and AMP2-2, respectively, via internal terminals n1-1 and n1-2. The non-inverting output terminals of the second-stage inverting amplifiers AMP2-1 and AMP2-2 are connected to output terminals out1 and out2, respectively. A capacitor C1 is connected between the inverting input terminal and non-inverting terminal of the second-stage inverting amplifier AMP2-1. A capacitor C2 is connected between the inverting input terminal and non-inverting terminal of the second-stage inverting amplifier AMP2-2.

In the voltage-to-current converter described above, the signals input to input terminals in1 and in2 are added/inverted by an input adder 201. The resultant signal is then amplified by first-stage inverting amplifiers AMP1-1 and AMP1-2 and second-stage inverting amplifiers AMP2-1 and AMP2-2 respectively arranged for two output terminals out1 and out2.

When two first-stage inverting amplifiers and two second-stage inverting amplifiers are separately arranged for the output terminals out1 and out2 as in this embodiment, internal terminals n1-1 and n1-2 do not interfere with each other. In other words, the internal terminal n1-1 between the first-stage and second-stage inverting amplifiers AMP1-1 and AMP2-1 does not interfere with the internal terminal n1-2 between the first-stage and second-stage inverting amplifiers AMP1-2 and AMP2-2. As a result, the output variation at the internal terminal n1-1 does not affect the internal terminal n1-2.

If a balanced amplifier is constructed by using a voltage-to-current converter according to this embodiment, influences on differential-mode components can be eliminated even when a phase compensating capacitance C2 is sufficiently increased and sufficient stability is ensured for common-mode components. This makes it possible to realize a stable balanced amplifier.

As each of the input adder 201, the first-stage inverting amplifiers AMP1 and AMP2, and the second-stage inverting amplifiers AMP2-1 and AMP2-2 a common source circuit in which two transistors are connected, at most, in series between power supply lines (between a power supply voltage Vdd and a power supply voltage Vss) as shown in FIG. 10 may be used.

The correspondence between the block diagram of the voltage-to-current converter of FIG. 12 and the circuit diagram of the voltage-to-current converter of FIG. 10 will be described. The input adder 201 in FIG. 12 corresponds to voltage-to-current converters 103 and 104 in FIG. 10. The inverting amplifiers AMP1-1 and AMP1-2 in FIG. 12 corresponds to an amplifier 105 in FIG. 10, and the inverting amplifiers AMP2-1 and AMP2-2 in FIG. 12 correspond to the n-channel transistors M5 and M11. In other words, the input adder 201 comprises two pairs of transistors M1 and M7 and transistors M2 and M8 and a pair of transistors M3 and M9. Each of the inverting amplifiers AMP-1 and AMP1-2 comprises a pair of transistors M4 and M10 connected in series as shown in FIG. 10. The inverting amplifier AMP2-2 comprises a pair of transistors M6 and M12 connected in series.

The voltage-to-current converter shown in FIG. 12 can be applied to the balanced amplifier shown in FIG. 1. That is, this voltage-to-current converter can be applied to the voltage-to-current converters Gm1 and Gm2 shown in FIG. 1.

As described above, the balanced amplifier of the present invention comprises voltage-to-current converters using simple common source amplifiers.

As a consequence, the maximum value of an output signal amplitude becomes larger than that in the prior art even in low-voltage operation without losing the common-mode component eliminating ability. In addition, since a common output voltage can be controlled by using the positive phase input terminal of each voltage-to-current converter used in the balanced amplifier of the present invention, when a filter is formed, the time constant can be easily controlled.

What is claimed is:

1. A voltage-to-current converter comprising:
   a first input terminal;
   a second input terminal;
   a first output terminal;
   a second output terminal;
   an adder configured to add voltage signals supplied to the first input terminal and the second input terminal respectively;
   a first inverting amplifier configured to reverse and amplify an output of the adder;
   a second inverting amplifier configured to reverse and amplify the output of the adder;
   a third inverting amplifier configured to reverse and amplify an output of the first inverting amplifier and to output a first reversed and amplified signal to the first output terminal as a first current signal;
   a fourth inverting amplifier configured to reverse and amplify an output of the second inverting amplifier and to output a second reversed and amplified signal to the second output terminal as a second current signal;

a first capacitor connected between an input terminal and an output terminal of the third inverting amplifier;

a second capacitor connected between an input terminal and an output terminal of the fourth inverting amplifier.

2. The voltage-to-current converter according to claim 1, wherein each of the adder, the first inverting amplifier, the second inverting amplifier, the third inverting amplifier and the fourth inverting amplifier includes two transistors connected in series between a first power source and a second power source, and a first voltage of the first power source is higher than a second voltage of the second power source.

3. A balanced amplifier comprising two voltage-to-current converters each according to claim 1, wherein the second input terminals and the second output terminals of the converters are connected in common, a differential input signal is input from the first input terminals of the converters, and a differential output signal is output from the first output terminals of the converters.

4. The voltage-to-current converter according to claim 2, wherein the adder comprises a first transistor, a second transistor, a third transistor, a fourth transistor, a fifth transistor, a sixth transistor, and an output terminal, a drain of the first transistor, a drain of the second transistor, a drain of the third transistor, a drain of the fourth transistor, a drain of the fifth transistor, a drain of the sixth transistor, a gate of sixth transistor and the output terminal are connected in common, a source of the first transistor, a source of the second transistor and a source of the fifth transistor are connected to the first power supply, a source of the third transistor, a source of the fourth transistor and a source of the sixth transistor are connected to the second power supply, a gate of the third transistor is connected to the first input terminal, and a gate of the fourth transistor is connected to the second input terminal.

5. The voltage-to-current converter according to claim 2, wherein each of the first inverting amplifier and the second inverting amplifier comprises a first transistor, a second transistor, and an output terminal;

a gate of the second transistor is configured to receive the output of the adder;

a drain of the first transistor, a drain of the second transistor and the output terminal are connected in common;

a source of the first transistor is connected to the first power supply; and a source of the second transistor is connected to the second power supply.

6. The voltage-to-current converter according to claim 2, wherein each of the third inverting amplifier and the fourth inverting amplifier further comprises a first transistor, and a second transistor;

a gate of the second transistor is connected to the inputer terminal;

a drain of the first transistor, a drain of the second transistor and the output terminal are connected in common;

a source of the first transistor is connected to the first power supply; and a source of the second transistor is connected to the second power supply.

7. A voltage-to-current converter, comprising:

a first input terminal;

a second input terminal;

a first output terminal;

a second output terminal;

an adder configured to add voltage signals supplied to the first input terminal and the second input terminal respectively;

a first inverting amplifier configured to reverse and amplify an output of the adder;

a second inverting amplifier configured to reverse and amplify an output of the first inverting amplifier and to output a first reversed and amplified signal to the first output terminal as a first current signal;

a third inverting amplifier configured to reverse and amplify an output of the first inverting amplifier and to output a second reversed and amplified signal to the second output terminal as a second current signal;

a first capacitor connected between an input terminal and an output terminal of the second inverting amplifier;

a second capacitor connected between an input terminal and an output terminal of the third inverting amplifier.

8. The voltage-to-current converter according to claim 7, wherein each of the adder, the first inverting amplifier, the second inverting amplifier, the third inverting amplifier and the fourth inverting amplifier includes two transistors connected in series between a first power source and a second power source, and a first voltage of the first power source is higher than a second voltage of the second power source.

9. A balanced amplifier comprising two voltage-to-current converters each according to claim 7, wherein the second input terminals and the second output terminals of the converters are connected in common, a differential input signal is input from the first input terminals of the converters, and a differential output signal is output from the first output terminals of the converters.

10. The voltage-to-current converter according to claim 8, wherein the adder comprises a first transistor, a second transistor, a third transistor, a fourth transistor, a fifth transistor, a sixth transistor, and an output terminal;

a drain of the first transistor, a drain of the second transistor, a drain of the third transistor, a drain of the fourth transistor, a drain of the fifth transistor, a drain of the sixth transistor, a gate of sixth transistor and the output terminal are connected in common;

a source of the first transistor, a source of the second transistor and a source of the fifth transistor are connected to the first power supply;

a source of the third transistor, a source of the fourth transistor and a source of the sixth transistor are connected to the second power supply;

a gate of the third transistor is connected to the first input terminal; and a gate of the fourth transistor is connected to the second input terminal.

11. The voltage-to-current converter according to claim 8, wherein the first inverting amplifier comprises a first transistor, a second transistor, and an output terminal;

a gate of the second transistor is configured to receive the output of the adder;

a drain of the first transistor, a drain of the second transistor and the output terminal are connected in common;

a source of the first transistor is connected to the first power supply; and a source of the second transistor is connected to the second power supply.

12. The voltage-to-current converter according to claim 8, wherein each of the second inverting amplifier and the third inverting amplifier further comprises a first transistor, and a second transistor;

a gate of the second transistor is connected to the input terminal;

a drain of the first transistor, a drain of the second transistor and the output terminal are connected in common;

a source of the first transistor is connected to the first power supply; and a source of the second transistor is connected to the second power supply.

* * * * *